United States Patent [19]

Tsay

[11] Patent Number: 5,087,834
[45] Date of Patent: Feb. 11, 1992

[54] BUFFER CIRCUIT INCLUDING COMPARISON OF VOLTAGE-SHIFTED REFERENCES

[75] Inventor: Ching-Yuh Tsay, Richardson, Tex.

[73] Assignee: Texas Instruments Incorporated, Dallas, Tex.

[21] Appl. No.: 493,085

[22] Filed: Mar. 12, 1990

[51] Int. Cl.⁵ ..................... H03K 17/16; H03K 19/02
[52] U.S. Cl. ..................... 307/443; 307/451; 307/263; 307/358; 307/359; 307/543; 307/546
[58] Field of Search ........ 307/443, 451, 263, 358-359, 307/543, 546

[56] References Cited

U.S. PATENT DOCUMENTS 4,859,871  8/1989  Kobayashi et al. ............... 307/359
4,906,914  3/1990  Ohsawa ............................ 307/296.6

OTHER PUBLICATIONS

D. J. Allstot, W. C. Black, Jr., "Technological Design Considerations for Monolithic MOS Switched-Capacitor Filtering Systems", Proc. IEEE, vol. 71, No. 8, pp. 967-986.
Y. A. Haque, R. Gregorian, et al., "A Two Chip PCM Voice CODEC with Filters", IEEE, vol. SC-14, No. 6, Dec. 1979, pp. 961-969.
Tat Choi, et al., "High Frequency CMOS Switched Capacitor Filters for Communication Applications", IEEE ISSCC, pp. 246-247, Feb. 1983.

*Primary Examiner*—Stanley D. Miller
*Assistant Examiner*—Margaret Rose Wambach
*Attorney, Agent, or Firm*—Robby T. Holland; Rene' E. Grossman; Richard L. Donaldson

[57] ABSTRACT

An integrated circuit that is useful as a buffer is disclosed. The integrated circuit has an input voltage shifter circuit for shifting an input voltage and an output voltage shifter circuit for shifting an output voltage. It has a first comparator circuit for comparing the input voltage to the output voltage and a second comparator circuit for comparing the shifted input voltage to the shifted output voltage. The first comparator circuit produces a first control signal and the second comparator circuit produces a second control signal. A voltage driver circuit receives the control signals and produces the output voltage. A capacitor to compensate the output voltage can be connected to the output voltage before it is applied to the first comparator circuit and to the output voltage shifter circuit.

19 Claims, 3 Drawing Sheets

BUFFER CIRCUIT INCLUDING COMPARISON OF VOLTAGE-SHIFTED REFERENCES

FIELD OF THE INVENTION

This invention is in the field of integrated circuits, and more specifically is directed to buffer circuits.

BACKGROUND OF THE INVENTION

Noise is always a consideration in dynamic random access memory, DRAM, design and is a major factor in causing invalid data. As the size of the DRAM array increases and more memory cells are added to form DRAMs of enormous storage capacity (for instance 16 mega bit DRAMs where more than 16 million bits of data may be stored on a single memory chip) the voltage lines that supply voltage to the array become lengthy, causing designers to be ever more concerned with noise considerations. Noise crossing a voltage line can cause the voltage on the line to swing. This can cause invalid data to be read from the memory array and can cause invalid data to be written to the memory array.

Some VLSI circuits use regulated voltages in their design and operation. It is believed that the use of regulated voltages add to the robustness of the overall VLSI design in controlling noise. It is known that regulated voltages may be supplied to a VLSI device from an external power supply. It is also known that regulated voltages may be generated on the VLSI chip itself by using voltage regulator circuits.

In the case of VLSI DRAM design, it has been discovered that it is desirable to use regulated voltages because they increase the noise margin of the device. However, problems arise in designing a suitable voltage regulator circuit. For instance, in VLSI DRAM design, the load on the output voltage of the voltage regulator circuit is large and varying due to many different transistors of the memory array switching on and off as the array inputs and outputs data. The switching of the transistors generates noise. Noise and loading can cause the output regulated voltage to become unstable thereby tending to become unsuitable for its intended purpose. A device is therefore needed to buffer the stable reference voltage.

Previous buffer devices have been found to be unsuitable. A push-pull type output driver is not suitable when the output voltage is close to one of the supply voltages due to threshold voltage loss on either output devices. A classic class AB type driver is not suitable because the standby current increases when the supply voltage increases. (It is known that for TTL logic signals, the supply voltage is designed for +5v, however, due to noise, loading, and other factors, the supply voltage typically swings between +4v and +6v.) Even with the addition of local feedback, the classic class AB driver does not respond unless the output voltage swings large enough. Additionally, the output stage has to be biased with some DC current. This makes it even more difficult to do output compensation. Although it offers better stability control, a single stage high gain buffer is not suitable because of the limit on both the input and output voltage ranges. Two stage buffers usually call for Miller compensation that uses a standard capacitor that is unavailable to most digital processes.

It is desirable therefore to have a buffer with output compensation that can be effectively used in the voltage regulator design of a VLSI DRAM. Ideally, the buffer should dissipate a constant current over supply variations while maintaining the ability to swing in response to output voltage variations. It should supply current drive and be able to both source and sink current at its output. It should be able to respond to output voltage noise.

It is an object of this invention to provide a buffer that provides output voltage close to its voltage supply.

It is a further object of this invention to provide a buffer that dissipates small and constant DC power over a wide range of voltage supply.

It is a further object of this invention to provide a buffer that provides both sourcing and sinking currents responsive to output changes.

It is a further object of this invention to provide a buffer that uses output compensation for stabilization.

Other objects and advantages of the invention will be apparent to those of ordinary skill in the art having reference to the following specification together with the drawings.

SUMMARY OF THE INVENTION

An integrated circuit wherein the output voltage follows the input voltage is disclosed. The integrated circuit has an input voltage level shifter circuit for shifting an input voltage and an output voltage level shifter for shifting an output voltage. It has a first comparator circuit for comparing the input voltage to the output voltage and a second comparator circuit for comparing the shifted input voltage to the shifted output voltage. The first comparator circuit produces a first control signal and the second comparator circuit produces a second control signal. A voltage driver circuit receives the control signals and produces the output voltage. A capacitor to compensate the output voltage can be connected to the output voltage, before it is applied to both the first comparator circuit and to the output voltage shifter circuit.

DETAILED DESCRIPTION OF THE PREFERRED EMBODIMENT

Figure 1:
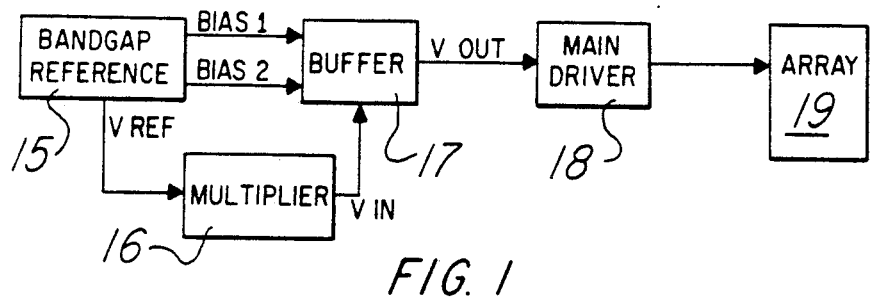
FIG. 1 is an electrical diagram, in block form, of an on-chip-regulated driver system for an integrated circuit.

FIG. 1 is an electrical diagram, in block form, of an on-chip regulated driver system for a VLSI circuit such as a 16 mega bit dynamic random access memory (DRAM). The system includes a conventional bandgap voltage reference generator circuit 15 for generating a stable reference voltage, VREF. Bandgap reference generator circuit 15 generates two additional voltages, BIAS 1 and BIAS 2 that are useful for providing constant current to portions of the integrated circuit to enhance performance. VREF is on the order of about +1.3 volts, while BIAS 1 and BIAS 2 are larger and respectively on the order of about +4.0v and +3.3v. Many such bandgap voltage reference generator circuits are well known in the art, and accordingly bandgap reference generator circuit will not be further discussed. VREF is presented to a voltage multiplier circuit 16 that increases the magnitude of VREF. Voltage multiplier circuit 16 may be constructed according to one of many conventional configurations. It generates, in this example, input voltage VIN that is applied to buffer 17. Buffer 17 will advantageously accommodate a wide range of values for input voltage VIN from multiplier 16 and has been simulated to perform for a VIN of between about 3.3v and +4.0v.

Buffer 17 provides output voltage VOUT to main driver 18 that is close in value to input voltage VIN. Its DC power dissipation is small and constant over the wide range of supply voltage. It provides both sourcing and sinking currents to main driver 18 as the output load changes, and, it uses output compensation to stabilize itself. Buffer 17 is the preferred embodiment of the invention and is further described below.

Main driver 18 of FIG. 1 powers memory array 19.

Figure 2:
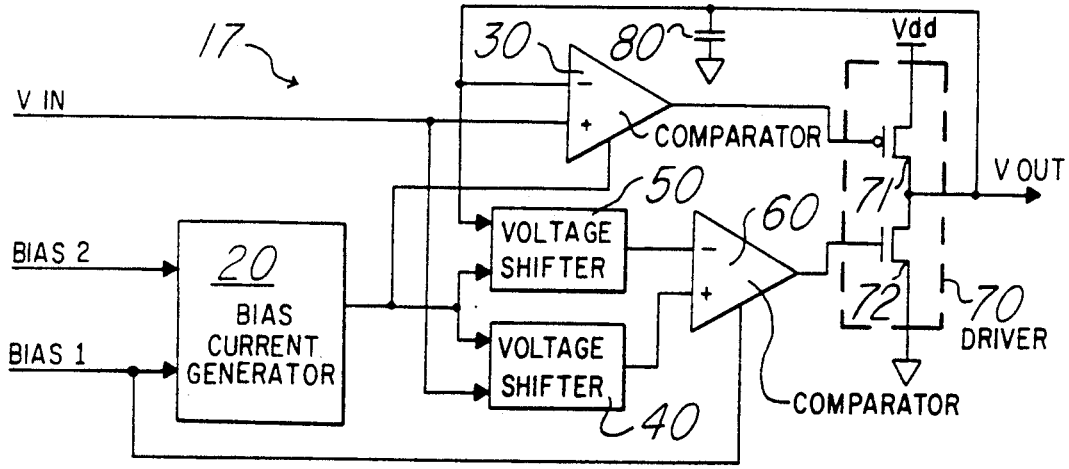
FIG. 2 is an electrical diagram, in partial block and partial schematic form of a buffer according to the preferred embodiment of the invention.

The below discussion is of FIG. 2. The specific description and operation of its components will follow in relation to the discussion of FIG. 3, the electrical schematic. FIG. 2 is an electrical diagram, in partial block and schematic form, of buffer 17 of FIG. 1 according to the preferred embodiment of the invention. Buffer 17 includes: a bias current generator 20; a comparator 30; a voltage shifter 40; a voltage shifter 50; a comparator 60; a driver 70; and a capacitor 80.

Bias current generator 20 of FIG. 2 receives voltages BIAS 1 and BIAS 2. Bias current generator 20 is responsive to produce a constant bias current input to comparator 30, voltage shifter 40, and voltage shifter 50. Comparator 30 receives input voltage VIN and feedback from output voltage VOUT. Comparator 30 compares output voltage VOUT to input voltage VIN and is responsive to produce a control signal that is input to a p-channel pull-up transistor 71 of a driver 70. Between output voltage VUT and comparator 30 is connected capacitor 80. Capacitor 80 is dependent upon output voltage VOUT and serves to stabilize output voltage VOUT.

Voltage shifter 40 of FIG. 2 receives input voltage VIN and is biased by bias current generator 20. Voltage shifter 40 is responsive to produce a voltage that is input to comparator 60 that is of a different level than input voltage VIN. Voltage shifter 40 may be referred to as an input level shifter.

Voltage shifter 50 receives the output voltage VOUT and is biased by the output of bias current generator 20. Voltage shifter 50 is responsive to produce a voltage that is input to comparator 60 that is of a different level than output voltage VOUT. Voltage shifter 50 may be referred to as an output level shifter. Comparator 60 receives the input level shifted voltage and the output level shifted voltage and is biased by voltage BIAS1. Comparator 60 compares the input and output level shifted voltages and is responsive to produce a control signal that is input to an n-channel pull-down transistor 72 of driver 70.

Driver 70 receives the output of comparator 30 on p-channel pull-up transistor 71 and receives the output of comparator 60 on n-channel pull-down transistor 72. Driver 70 is responsive to produce the output voltage VOUT. As will be explained later in further detail, the output of comparator 30 primarily controls the ability of driver 70 to increase the level of output voltage VOUT while the output of comparator 60 primarily controls the ability of driver 70 to decrease the level of output voltage VOUT. Driver 70 thus functions as a push-pull type driver. Driver 70 is constructed so that in steady state conditions with a constant load on VOUT, it draws very little DC current.

One end of Capacitor 80 is connected to output voltage VOUT. The other end of capacitor 80 is connected to ground. Output voltage VOUT produced by driver 70 is then input to comparator 30 and voltage shifter 50 providing negative feedback.

Figure 3:
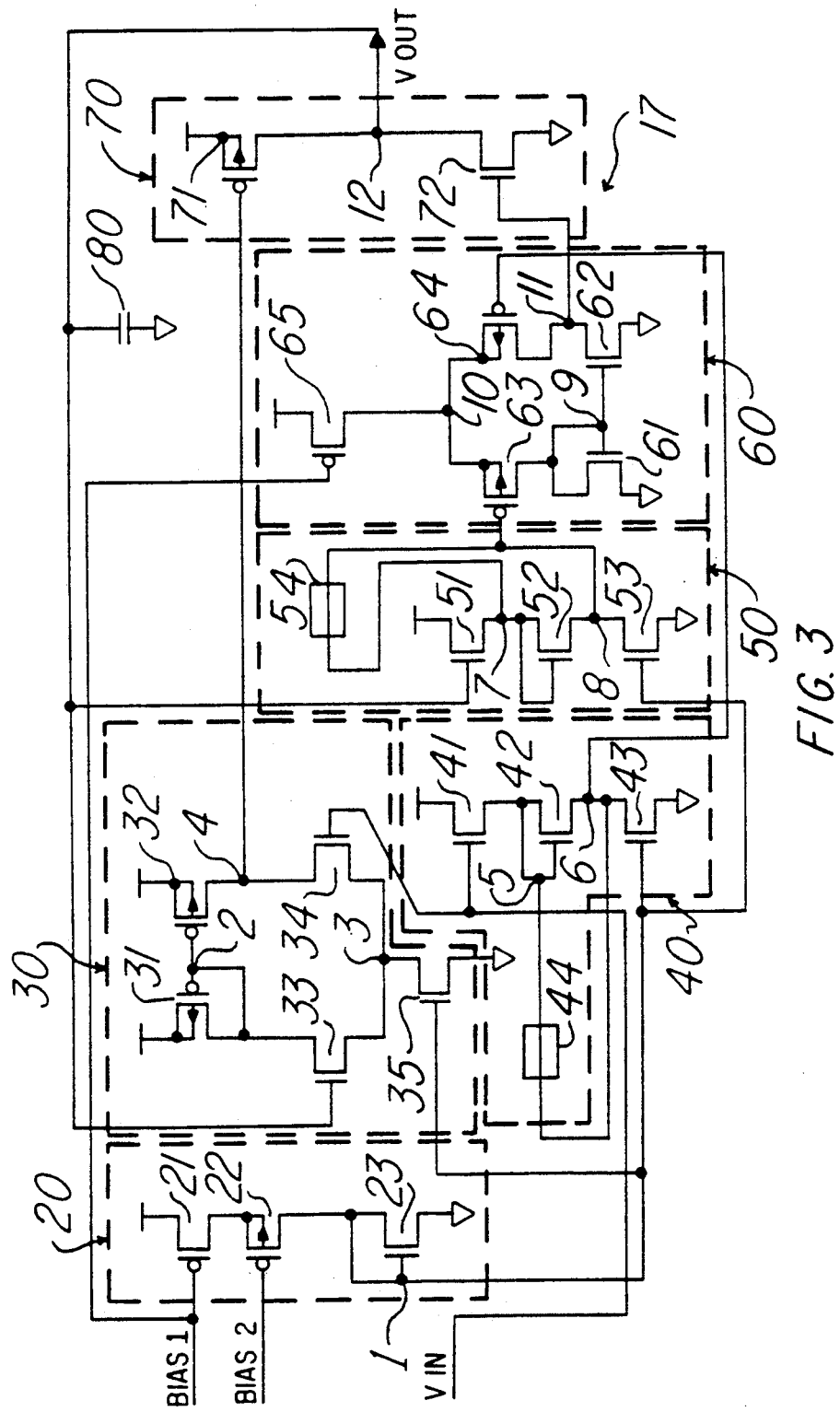
FIG. 3 is an electrical diagram, in schematic form, of a buffer according to the preferred embodiment of the invention.

Referring to FIG. 3, the electrical schematic schematic diagram of the preferred embodiment of buffer 17 is discussed.

In FIG. 3, bias current generator 20 is formed of p-channel transistors 21 and 22, and n-channel transistor 23. P-channel transistors 21 and 22 are connected in series. The source of p-channel transistor 21 is connected to Vdd. (As is known in the art, Vdd is typically unregulated on chip and often ranges between 4.0 volts and +6.0 volts.) The drain of p-channel transistor 21 is connected to the source of p-channel transistor 22. The drain of p-channel transistor 22 is connected to the drain and gate of n-channel transistor 23 at a node 1. The output of current bias generator 20 is taken at node 1. The source of n-channel transistor 23 is connected to ground. Voltage BIAS 1 is connected to the gate of p-channel transistor 21 and voltage BIAS 2 is connected to the gate of p-channel transistor 22. In order to ensure better current mirror effect, it is preferable that the transistor length of n-channel transistor 23 be relatively long—on the order of about 6 microns, for instance.

Comparator 30 of FIG. 3 is formed of p-channel transistors 31 and 32, and, n-channel transistors 33, 34, and 35. Comparator 30 is configured according to conventional techniques, with the n-channel MOS differential amplifier of transistors 33 and 34 having a current mirror active load of p-channel transistors 31 and 32. Input voltage VIN is connected to comparator 30 via its connection to the gate of n-channel transistor 34. Output voltage VOUT is connected to comparator 30 via its connection to the gate of n-channel transistor 33 to provide feedback. The gate of n-channel transistor 35 is connected to node 1. The source of n-channel transistor 35 is connected to ground while its drain is connected to the sources of n-channel transistors 33 and 34. P-channel transistor 31 has its source biased at Vdd and has its drain connected to the drain of n-channel transistor 33. Similarly, p-channel transistor 32 has its source biased at Vdd and has its drain connected to the drain of n-channel transistor 34. The gates of p-channel transistors 31 and 32 are connected together at a node 2. Also connected at node 2 is the drain/drain connection of p-channel transistor 31 and n-channel transistor 33. The drains of p-channel transistor 32 and n-channel transistor 34 are connected to a node 4 that controls the gate of p-channel pull-up transistor 71 of driver 70.

In comparator 30, the sizes of certain transistor pairs are preferably well matched to enhance its performance as will be later explained. It is desirable that the width to length ratios of p-channel transistors 31 and 32 be matched. It is desirable that the ratios of n-channel transistors 33 and 34 be matched. N-channel transistor 35 is sized in proportional to n-channel transistor 23 of bias current generator 20 so that comparator 30 works with sufficient biasing current while keeping minimum standby current in current generator 20.

Voltage shifter 40 of FIG. 3 is formed of n-channel transistors 41, 42, 43, and fuse 44. The source of n-channel transistor 41 is biased at Vdd. The drain of n-channel transistor 41 is connected to the drain of n-channel transistor 42 at a node 5. The source of n-channel transistor 43 is biased at ground and its drain is connected to the source of n-channel transistor 42 at a node 6. Also connected to node 5 is the gate of n-channel transistor 42 and one side of fuse 44. The other side of fuse 44 is connected to node 6. Driving the gate of n-channel transistor 41 is input voltage VIN. The gate of n-channel transistor 43 is connected the output of bias current generator 20 at node 1. The output of voltage shifter 40 taken from node 6 is connected to p-channel transistor 64 of comparator 60.

It is preferable that the device sizes of n-channel transistors 41, 42 be about the same so that they each have about the same threshold voltage Vt. A transistor size on the order of about 10 is appropriate. It is also preferable that the width to length ratio of n-channel transistor 43 be the same as n-channel transistor 23 of bias current generator 20 as will be later explained.

Voltage shifter 50 of FIG. 3 is formed similarly to voltage shifter 40 and includes n-channel transistors 51, 52, 53, and fuse 54. The source of n-channel transistor 51 is biased at Vdd. The drain of n-channel transistor 51 is connected to the drain of n-channel transistor 52 at a node 7. The source of n-channel transistor 53 is biased at ground and its drain is connected to the source of n-channel transistor 52 at a node 8. Also connected to node 7 is the gate of n-channel transistor 52 and one side of fuse 54. The other side of fuse 54 is connected to node 8. Driving the gate of n-channel transistor 51 is the output voltage VOUT. The gate of n-channel transistor 53 is connected to the output of bias current generator 20 at node 1. The shifted output voltage of shifter 50 is drawn from node 8 and is connected to p-channel transistor 63 of comparator 60.

It is also preferable that the device sizes and threshold voltages of n-channel transistors 51, 52, and 53 of voltage shifter 50 of FIG. 3 correspond respectively to those of n-channel transistors 41, 42, and 43 of voltage shifter 40

Comparator 60 of FIG. 3 is formed of n-channel transistors 61 and 62, and p-channel transistors 63, 64, and 65. Comparator 60 is configured similarly to comparator 30 according to conventional techniques with the p-channel MOS differential amplifier of transistors 63 and 64 having a current mirror active load of n-channel transistors 61 and 62. The output of voltage shifter 50 is connected to comparator 60 via its connection to the gate of p-channel transistor 63. The output of voltage shifter 40 is connected to comparator 60 via its connection to the gate of p-channel transistor 64. The gate of p-channel transistor 65 is connected to the voltage BIAS 1. The source of p-channel transistor 65 is connected to Vdd while its drain is connected to the sources of p-channel transistors 63 and 64. N-channel transistor 61 has its source biased at ground and has its drain connected to the drain of p-channel transistor 63. Similarly, n-channel transistor 62 has its source biased at ground and has its drain connected to the drain of p-channel transistor 64. The gates of n-channel transistors 61 and 62 are connected together at a node 9. Also connected to node 9 is the drain/drain connection of n-channel transistor 61 and p-channel transistor 63. The drains of n-channel transistors 62 and p-channel transistor 64 are connected to a node 11 that controls the gate of n-channel pull-down transistor 72 of driver 70.

In comparator 60, as in comparator 30, the sizes of certain pairs are preferably well matched. It is desirable that the ratios of n-channel transistors 61 and 62 be on the order of about 10. It is desirable that the ratios of p-channel transistors 63 and 64 be on the order of about 20. P-channel transistor 65 is sized in proportion to p-channel transistor 21 of bias current generator 20 so that comparator 60 works with sufficient biasing current while keeping minimum standby current in current generator 20.

Driver 70 of FIG. 3 is formed of p-channel pull-up transistor 71 and n-channel pull-down transistor 72. P-channel pull-up transistor 71 and n-channel pull-down transistor 72 are connected in series with the source of p-channel pull-up transistor 71 being biased at Vdd and with the source of n-channel pull-down transistor 71 being biased at ground. The output of comparator 30 drives the gate of p-channel pull-up transistor 71, and, the output of comparator 60 drives the gate of n-channel pull-down transistor 72. The output voltage Vout is taken at a node 12 of driver 70 between the drains of the transistors 71 and 72.

The device sizes of p-channel pull-up transistor 71 and n-channel pull-down transistor 72 are preferably such that p-channel transistor 71 is much larger than n-channel transistor 72. This can be accomplished by increasing the channel length of n-channel pull-down transistor 72 (on the order of 6 microns, for example). This also increases its threshold voltage Vt and therefore results in virtually zero DC bias in n-channel pull-down transistor 72.

In FIG. 3, a capacitor 80 is connected to output voltage VOUT before it is fed into the gate of n-channel transistor 33 of comparator 30 and before it is feed into the gate of n-channel transistor 51 of voltage shifter 50. Capacitor 80 is in the order of 100 picofarads.

The transistor sizes (channel width to channel length) ratios of transistors 21, 22, 23, 35, 43, 53, and 65, are such that these transistors operate in the saturation region.

Referring now to FIGS. 2 and 3, the operation of buffer 17 is now discussed.

With respect to current generator 20, as Vdd varies, the voltages BIAS 1 and BIAS 2 will vary slightly while keeping the current through transistors 21 and 22 constant. This constant current is mirrored to the devices connected to node 1. The ratio between the sizes of the devices connected to node 1 and that of transistor 23 determine the amount of current mirror they receive. With the transistor width to length ratios of transistors 43 and 53 being the same as that of transistor 23, they each mirror the same current as that of transistor 23. Transistor 35 is about five times larger and receives approximately five times the current as transistors 43 and 53. With device sizes of buffer 17 as described above, the constant current passing through node 1 is approximately 0.5 microamps. The transistor channel length of transistor 65 is such that it tends to minimize current variation and works as a better current mirror. Voltage shifters 40 and 50 help in lowering the voltages at the gates of transistors 63 and 64 and therefore, lowering the drain voltage of transistor 65 to better ensure transistor 65 is in saturation.

Fuse 44 of voltage shifter 40 advantageously provides the ability to operate buffer 17 for different values of input voltage VIN. With N-channel transistors 41 and 42 of voltage shifter 40 about same size—they each have about the same threshold voltage Vt. When fuse 44 is closed, as it is in the case where input voltage VIN has a value of +3.3v, nodes 5 and 6 are shorted together. There is no voltage drop across n-channel transistor 42. The voltage at node 6 equals VIN minus the Vt of n-channel transistor 41, or +3.3v−Vt T41. In the case where input voltage VIN has the larger value of +4.0v, fuse 44 is opened. (It is well known in the art of integrated circuits that fuse 44 can be opened by using a laser.) Nodes 5 and 6 are separated and there is now a Vt voltage drop across n-channel transistor 42. The voltage at node 6 equals VIN minus the Vts of n-channel transistors 41 and 42, or, +4.0v−(Vt T41 +Vt T42). With the transistors having about the same threshold voltages, the voltage at node 6 for a VIN of +4.0v is about the same as the voltage at node 6 for a VIN of 3.3v. Thus input voltage VIN can advantageously be shifted to a level of one or two Vt's lower, depending upon whether fuse 44 is opened or closed, while the input to comparator 60 is held constant and below supply voltage Vdd without redesign and resizing.

Voltage level shifter 50 operates similar to voltage level shifter 40 except that output voltage VOUT applied to the gate of n-channel transistor 51 is shifted to a level of two or one Vt's lower, depending upon whether fuse 54 connected across n-channel transistor 52 is opened or closed. The same considerations discussed relative to voltage shifter 40 govern whether fuse 54 is opened or closed.

Turning now to comparator 30, comparator 30 receives a constant current bias from n-channel transistor 35. N-channel transistor 35 acts as a current source to ground. The sources of n-channel transistors 33 and 34 are pulled by n-channel transistor 35 to a voltage that is an n-channel threshold voltage below the voltages applied to the gates of n-channel transistors 33 and 34. (Input voltage VIN is applied to the gate of transistor 34; output voltage VOUT is applied to the gate of transistor 33.) This allows transistors 33 and 34 to be conductive responsive to the voltages applied to their respective gates, enabling the operation of comparator 30 to apply a voltage to node 4 that is based upon the difference between voltage VIN and output voltage VOUT.

As discussed above, it is preferable that transistors 33 and 34 be closely matched to each other, and that transistors 31 and 32 be closely matched to each other, and that transistor 35 operate in the saturation region. With adequate matching of the transistors pairs, the operation of comparator 30 will tend toward a point where the current passing through transistors 32 and 34 will match the current passing through transistors 31 and 33, with the gate-to-source voltages of transistors 31 and 32 becoming equal. Accordingly, comparator 30 will, in the steady-state, reach the operating condition where the output voltage VOUT equals the input voltage VIN.

If the output voltage VOUT suddenly decreases in response to a changing load or noise and is less than input voltage VIN. Transistor 34 becomes more conductive than transistor 33, due to the voltage on its gate, input voltage VIN, being larger than the voltage on the gate of transistor 34, output voltage VOUT. Accordingly, the bulk of the current through current source transistor 35 is drawn by transistors 32 and 34, rather than by transistors 31 and 33. In order to satisfy the transistor current-voltage relationships, the high current passing through transistor 32 relative to transistor 31 causes the voltage at the drain of transistor 31 to rise toward Vdd, and causes the voltage at the drain of transistor 32 to fall toward ground. With the drains of transistors 34 and 32 at node 4 falling, p-channel pull-up transistor 71 of driver 70 is driven harder. It becomes more conductive and pulls output voltage VOUT towards Vdd thereby increasing it.

Turning now to comparator 60, comparator 60 receives a constant current bias from p-channel transistor 65. P-channel transistor 65 acts as a current source from supply voltage Vdd on its source. The sources of p-channel transistors 63 and 64 are pulled by p-channel transistor 65 to a voltage that is a p-channel threshold voltage above the voltages applied to the gates of p-channel transistors 63 and 64. (The output of level shifter 50 that is one or two Vts less than output voltage VOUT is applied to the gate of transistor 63; the output of level shifter 40 that is one or two Vts less than input voltage VIN is applied to the gate of transistor 64.) This allows transistors 63 and 64 to be conductive responsive to the voltages applied to their respective gates, enabling the operation of comparator 60 to apply a voltage to node 11 that is based upon the difference between the level shifted input voltage and the level shifted output voltage VOUT.

As discussed above, it is preferable that transistors 63 and 64 be closely matched to each other, and that transistors 61 and 62 be closely matched to each other. With adequate matching of the transistor pairs, the operation of comparator 60 will tend toward a point where the current passing through transistors 62 and 64 will match the current passing through transistors 61 and 63, with the gate-to-source voltages of transistors 61 and 62 becoming equal.

If the output voltage VOUT suddenly increases in response to a changing load, transistor 63 is less conductive than transistor 64, due to the voltage on its gate, level shifted output voltage VOUT, being larger than the voltage on the gate of transistor 64, level shifted input voltage VIN. Accordingly, the bulk of the current through current source transistor 65 is drawn by transistors 62 and 64, rather than by transistors 61 and 63. In order to satisfy the transistor current-voltage relationships, the low current passing through transistor 63 relative to transistor 64 causes the voltage at the drain of transistor 63 to fall towards ground and causes the voltage at the drain of transistor 64 to rise towards Vdd. With the drains of transistors 62 and 64 increasing, n-channel pull-down transistor 72 of driver 70 is driven harder. It becomes more conductive and pulls output voltage VOUT towards ground thereby decreasing it.

With comparator 30 controlling p-channel pull-up transistor 71 of driver 70 and comparator 60 controlling n-channel pull-down transistor 72 of driver 70, driver 70 functions as a push-pull driver. When the output voltage decreases, both node 4 and node 11 come down. Node 4 increases source current from p-channel pull-up transistor 71 while node 11 reduces the sinking current in n-channel pull-down transistor 72. On the other hand, when the output voltage goes up, the negative feedback from output voltage VOUT forces both node 4 and node 11 up. Node 4 reduces the source current in p-channel pull-up transistor 71 and node 11 increases the sinking current in n-channel pull-down transistor 72.

Buffer 17 can be referred to as a Class B type amplifier. At steady state, very little DC current is drawn by driver 70. By choosing transistor 72 with a longer channel length than transistor 62, the threshold voltage of transistor 72 is made larger than the threshold voltage of transistor 62. At steady state, transistor 72 is off and transistor 71 is on.

Simulations reveal that the current at node 12 of buffer 17 remains essentially constant over a wide range of operating conditions. Table 1 contains simulation data for input voltage VIN of +3.3v. Table 2 contains simulation data for input voltage VIN of +4.0v.

TABLE 1

| VIN | Vdd | Source Current | Sink Current |
|---|---|---|---|
| +3.3 V | +4.0 | 7.37 μA | 7.37 μA |
|  | +5.0 | 7.37 μA | 7.37 μA |
|  | +6.0 | 7.38 μA | 7.38 μA |

TABLE 2

| VIN | Vdd | Source Current | Sink Current |
|---|---|---|---|
| +4.0 V | +4.0 | 7.53 μA | 7.53 μA |
|  | +5.0 | 7.54 μA | 7.54 μA |
|  | +6.0 | 7.56 μA | 7.56 μA |

Figure 4:
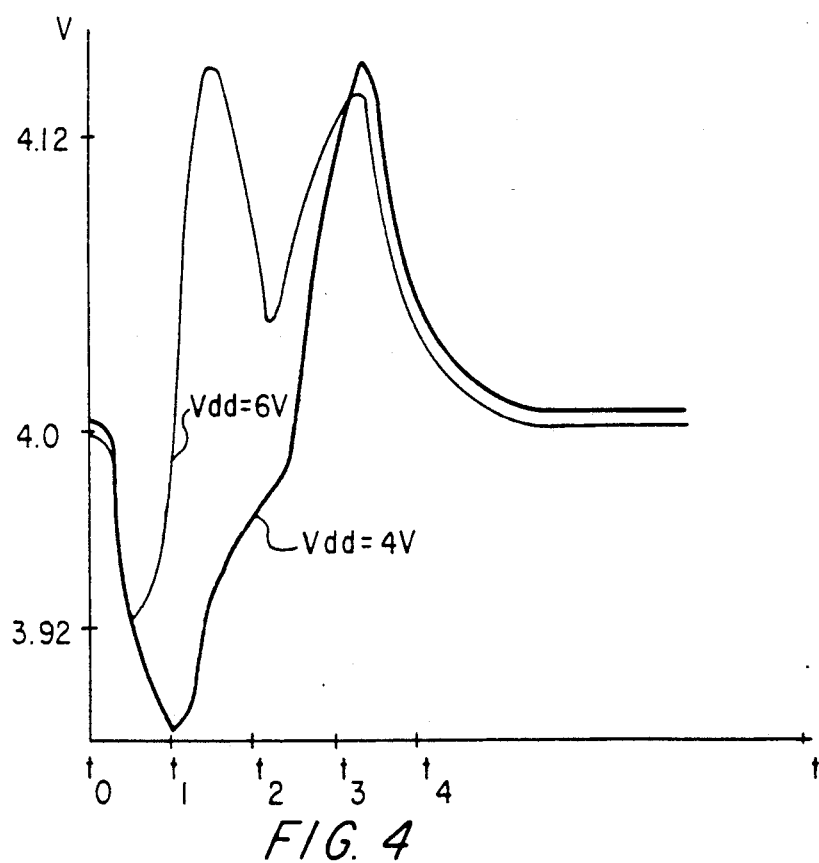
FIG. 4 is a timing diagram illustrating the operation of the buffer of FIGS. 2 and 3.

FIG. 4 is a timing diagram illustrating the operation of buffer 17. Two timing lines are illustrated, one for Vdd of =6.0v and one for Vdd of +4.0v. For both timing lines, VIN equals +4.0v. The response time of the circuit, illustrated on the horizontal axis, is on the order of tenths of microseconds.

Referring to the timing line of FIG. 4 where Vdd equals +4.0v, between times t0 and t1, the load increases and draws more current, consequently, output voltage VOUT drops as buffer 17 sources more current. Between times t1 and t2, buffer 17 responds. P-channel pull-up transistor 71 of driver 70 is driven harder and output voltage VOUT is pulled up to VIN. However, between times t2 and t3, the load decreases and draws less current, consequently, output voltage VOUT increases as buffer sinks more current. Between times t3 and t4, buffer 17 responds. N-channel pull-down transistor 72 of driver 70 is driven harder and output voltage VOUT is pulled down to VIN.

Thus, the invention enables a VLSI device such as a DRAM to make effective use of regulated voltages in controlling noise. It has output compensation and is able to respond to output voltage noise. It dissipates a constant current over variations in supply voltage.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

What is claimed is:

1. An integrated circuit comprising:
   a voltage generator circuit for receiving a first control signal and a second control signal, and for producing an output voltage;
   a first control circuit for receiving the output voltage and an input voltage, and for producing the first control signal; and
   a second control circuit for receiving the output voltage and the input voltage, and for producing the second control signal, the second control circuit comprising:
   an input voltage shifter circuit for shifting the input voltage;
   an output voltage shifter circuit for shifting the output voltage; and
   a voltage comparator circuit for comparing the shifted input voltage to the shifted output voltage.

2. The integrated circuit of claim 1 further comprising:
   a capacitor connected to the output voltage for coupling the output voltage to the first control circuit.

3. An integrated circuit, comprising:
   a voltage driver for receiving a first control signal and a second control signal, and for producing an output voltage;
   a first comparator circuit for receiving the output voltage and an input voltage, and for producing the first control signal;
   a control circuit for receiving the output voltage and the input voltage, and for producing the second control signal, the control circuit comprising:
   an input voltage shifter circuit for shifting the input voltage;
   an output voltage shifter circuit for shifting the output voltage;
   a second comparator circuit for comparing the shifted input voltage to the shifted output voltage; and
   a capacitor connected to the output voltage for coupling the output voltage to the output voltage shifter circuit.

4. The integrated circuit of claim 3 further comprising:
   a bias current generator circuit for receiving a bias voltage and producing a current to bias the first comparator circuit, the input voltage shifter circuit, and the output voltage shifter circuit.

5. The integrated circuit of claim 4 wherein the second comparator receives the bias voltage.

6. The integrated circuit of claim 3 wherein the voltage driver comprises:
   a pull-up transistor and a pull-down transistor connected in series, the pull-up transistor being biased at a higher potential than the pull-down transistor, the pull-up transistor receiving the first control signal, and the pull-down transistor receiving the second control signal.

7. The integrated circuit of claim 6 wherein the first comparator comprises:
   an n-channel MOS differential amplifier;
   a current mirror active load of p-channel transistors connected to the n-channel MOS differential amplifier; and
   an n-channel current source transistor connected to the n-channel MOS differential amplifier.

8. The integrated circuit of claim 7 wherein the second comparator comprises:
   a p-channel MOS differential amplifier;
   a current mirror active load of n-channel transistors connected to the p-channel MOS differential amplifier; and
   a p-channel current source transistor connected to the p-channel MOS differential amplifier.

9. A buffer circuit comprising:
   a input voltage shifter circuit for forming a shifted input voltage from an input voltage;

a output voltage shifter circuit for forming a shifted output voltage from an output voltage;

a first comparator circuit for comparing the input voltage to the output voltage and producing a first control signal;

a second comparator circuit for comparing the shifted input voltage to the shifted output voltage and producing a second control signal; and a voltage driver circuit for receiving said first control signal and said second control signal and producing the output voltage.

10. The buffer of claim 9 further comprising:

a capacitor for coupling the output voltage of the voltage driver circuit to the first comparator and to the output voltage shifter circuit.

11. The buffer of claim 13 wherein the input voltage shifter has a fuse that may be blown to decrease the shifted input voltage; and wherein the output voltage shifter circuit has a fuse that may be blown to decrease the shifted output voltage.

12. An amplifier, comprising:

a first differential input stage having two inputs and an intermediate output, one input connected to an input voltage terminal and the other input connected to an output voltage terminal;

a first voltage shifter connected to the output voltage terminal;

a second voltage shifter connected to the input voltage terminal;

a second differential input stage having two inputs and an intermediate output, one input connected to the first voltage shifter and the other input connected to the second voltage shifter; and a driver having one input connected to the intermediate output of the first differential input stage and another input connected to the intermediate output of the second differential input stage.

13. The amplifier of claim 12 wherein the first differential input stage is an n-channel MOS differential amplifier and the second differential input stage is a p-channel MOS differential amplifier.

14. The amplifier of claim 13 wherein the driver comprises a p-channel transistor and an n-channel transistor both having gates, the gate of the p-channel transistor being connected to the intermediate output of the first differential input stage and the gate of the n-channel transistor being connected to the intermediate output of the second differential input stage.

15. The amplifier of the claim 14 further including a capacitor connected to the another input of the first differential input stage.

16. An on chip regulated driver system for a semiconductor device having a memory array, comprising:

a reference generator circuit to generate a reference voltage having a magnitude and a bias voltage;

a multiplier circuit, connected to the reference generator circuit, to provide an increased magnitude reference voltage;

a main driver circuit to supply a semiconductor memory array with voltage;

a buffer circuit that is connected between the reference generator circuit and the main driver circuit and that is connected to the multiplier circuit, to provide an intermediate drive voltage to the main driver circuit and to isolate the reference generator circuit from noise in the memory array, comprising:

a first level changer circuit to produce a voltage of different level than that of the increased magnitude reference voltage;

a second level changer circuit to produce a voltage of different level than that of the intermediate drive voltage;

a first comparator circuit to compare the voltage produced by the first level changer circuit with the intermediate drive voltage and to produce a first control signal;

a second comparator circuit to compare the voltage produced by the second level changer circuit with the intermediate drive voltage and to produce a second control signal; and an intermediate driver circuit to receive the first control signal and the second control signal and to produce the intermediate drive voltage that is supplied to the main driver circuit.

17. A method of operating a buffer circuit that receives a voltage and outputs a voltage, comprising the steps of:

shifting a voltage received by to a buffer circuit to produce an input shifted voltage;

shifting a voltage output by the buffer circuit to produce an output shifted voltage;

comparing the input shifted voltage to the output shifted voltage;

comparing the voltage received by the buffer circuit to the voltage output by the buffer circuit; and adjusting the voltage output by the buffer circuit in response to comparing the input shifted voltage with the output shifted voltage and in response to comparing the voltage received by the buffer circuit with the voltage output by the buffer circuit.

18. A method of supplying a memory device with a regulated memory array drive voltage, comprising the steps of:

comparing a reference voltage with a memory array drive voltage;

comparing a level shifted reference voltage to a level shifted memory array drive voltage; and sourcing or sinking current, from a driver supplying the memory array drive voltage, in response to comparing the reference voltage with the memory array drive voltage, and in response to comparing the level shifted reference voltage with the level shifted memory array drive voltage.

19. The method of claim 18 wherein the memory device is a semiconductor memory device and the reference voltage is produced by an on chip reference generator.

* * * * *